United States Patent
Satoh et al.

(10) Patent No.: US 6,696,702 B2
(45) Date of Patent: Feb. 24, 2004

(54) SILICON CARBIDE SEMICONDUCTOR SWITCHING DEVICE

(75) Inventors: Katsumi Satoh, Tokyo (JP); Youichi Ishimura, Tokyo (JP); Hideki Haruguchi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/162,616

(22) Filed: Jun. 6, 2002

(65) Prior Publication Data

US 2002/0195682 A1 Dec. 26, 2002

(30) Foreign Application Priority Data

Jun. 25, 2001 (JP) ......................................... 2001-191072

(51) Int. Cl.[7] ..................... H01L 3/0312; H01L 29/00; H01L 29/861; H01L 29/74; H01M 8/04
(52) U.S. Cl. ..................... 257/77; 257/532; 257/533; 257/536; 257/537; 257/551; 257/603; 257/104; 257/106; 257/154; 257/481; 429/22
(58) Field of Search ..................... 257/531, 77, 532, 257/533, 536, 537, 154, 104, 106, 481, 551, 603; 429/22

(56) References Cited

U.S. PATENT DOCUMENTS 6,248,461 B1 * 6/2001 Abe et al. ..................... 429/22

FOREIGN PATENT DOCUMENTS

| JP | 5-183121 | * 7/1993 | ................. 257/77 |
| JP | 11-178353 | 7/1999 | |

* cited by examiner

Primary Examiner—Steven Loke
(74) Attorney, Agent, or Firm—Oblon, Spivak, McClelland, Maier & Neustadt, P.C.

(57) ABSTRACT

An object of the present invention is to improve the relationship between the switching loss and the conduction loss in a semiconductor device comprising a diode and a switching device made of silicon carbide, while suppressing occurrence of voltage oscillation of the device having a high amplitude. A resistor (12) is connected in parallel to a diode (11) made of silicon carbide. Although a resistive component of the diode (11) varies widely with turn-on and turn-off of the diode (11), connecting the resistor (12) in parallel to the diode (11) allows suppression of variations in a resistive component of an LCR circuit formed by the diode (11) and an external wiring. Accordingly, the LCR circuit is unlikely to satisfy the condition of natural oscillation and an increase in the quality factor of the LCR circuit is suppressed.

4 Claims, 5 Drawing Sheets

F I G . 3 A   F I G . 3 B
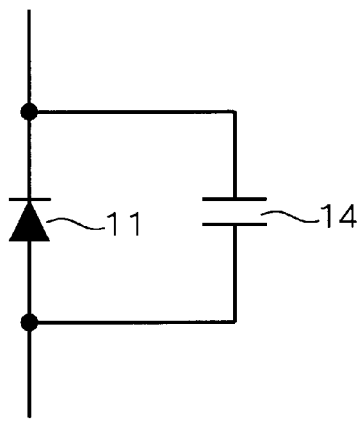 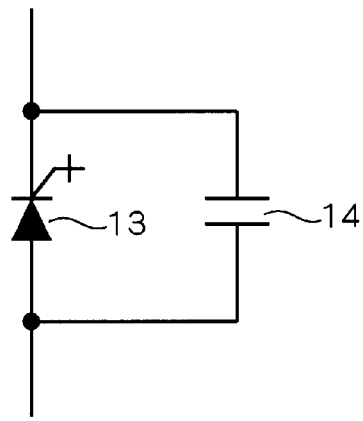
F I G . 4 A   F I G . 4 B
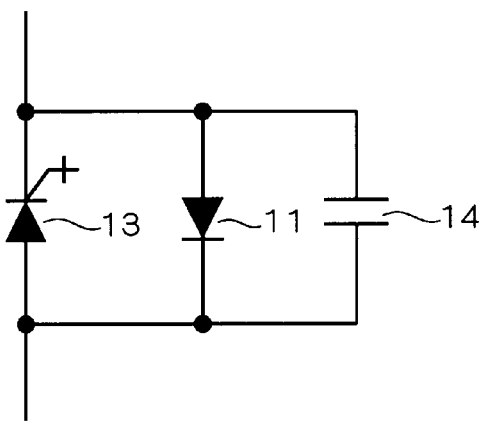 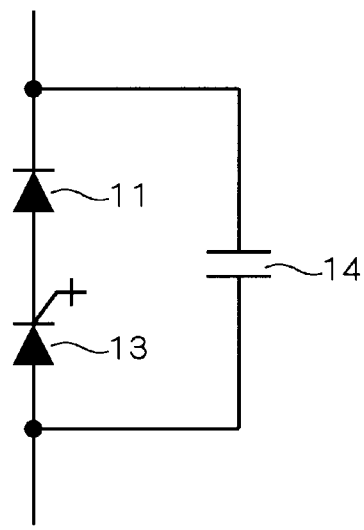

SILICON CARBIDE SEMICONDUCTOR SWITCHING DEVICE

BACKGROUND OF THE INVENTION

1. Field of the Invention

The present invention relates to a semiconductor device comprising a diode and a switching device made of silicon carbide.

2. Description of the Background Art

Diodes and switching devices such as thyristors and transistors have conventionally been used in many semiconductor devices.

When a switching device is in an ON-state or a diode is in a forward bias state, that is, a device is in a conductive state, a relatively large amount of charge accumulates inside the device. On the other hand, when the switching device is in an OFF-state or the diode is in a reverse bias state, that is, the device is in a nonconductive state, a space-charge layer is formed inside the device, without a large amount of charge existing therein.

Therefore, during a process in which the device undergoes a transition from a conductive state to nonconductive state (turn-off), the charge accumulating inside the device has to be vanished. During this process, current larger than that in the nonconductive state flows, which causes power dissipation (turn-off power dissipation). Larger the amount of charge accumulating in the device in the conductive state, larger current flows at the turn-off, which results in an increase in the turn-off power dissipation.

Moreover, during a process in which the device undergoes a transition from the nonconductive state to the conductive state, charge should accumulate inside the device. During this process, voltage necessary for flowing current through the device becomes higher than that in the conductive state, which causes power dissipation (turn-on power dissipation). Larger the amount of charge accumulating inside the device during this process, more time is required for the accumulation, which results in an increase in the turn-on power dissipation.

The sum of the turn-on power dissipation and the turn-off power dissipation is called switching loss. Especially in a high-voltage device, the switching loss is great, by which a semiconductor device is seriously affected. This imposes essential limitations on the switching performance of the device. As a result, limitations shall be imposed on the performance of the semiconductor device.

The foregoing shows that a reduction of the amount of charge accumulating in the conductive state of the device makes it possible to suppress the switching loss. However, when a small amount of charge accumulates in the conductive state, a voltage drop in the conductive state becomes greater, which means an increase in conduction loss of the device.

In other words, the switching loss and the conduction loss have the trade-off relationship. The relationship depends on the voltage blocking capability of the device and deteriorates as the voltage blocking capability increases.

Further, making the device thin allows a reduction of the conduction loss as well as allowing large current to flow with a small amount of charge. This improves the relationship between the switching loss and the conduction loss. However, making the device thin causes deterioration in the withstand voltage characteristics of the device. Therefore, for a device with high voltage such as a power converter, there is a limit in making the device thin.

For the sake of solving the above problems and achieving energy saving, positive attempts are being made to improve the relationship between the switching loss and the conduction loss in a diode and a switching device used for power conversion in a semiconductor device. In one of such attempts, a diode and a switching device which have conventionally been made of silicon are made of silicon carbide.

Since silicon carbide has a reverse breakdown field substantially ten times that of silicon and excellent withstand voltage characteristics, it is suitable for a device that operates under the condition where high voltage is generated in a blocking state of the device. In other words, a thickness of the device necessary for maintaining voltage of a value can be made much thinner than that of a device made of silicon necessary for maintaining voltage of the same value. This is expected to contribute to an improved relationship between the switching loss and the conduction loss.

Further, since silicon carbide has a wide energy gap between bands and an excellent thermal stability, a device made of silicon carbide can operate at high temperatures approximately under 1000 kelvin. Furthermore, since silicon carbide has a high thermal conductivity to thereby radiate heat effectively, a device made of silicon carbide can be arranged with high density. In view of these characteristics as well, silicon carbide is expected to be applied to a next-generation power semiconductor device.

The diode and switching device made of a semiconductor material such as silicon or silicon carbide as described above obtain the capability of blocking voltage by means of space-charge layers formed therein. On the other hand, charge accumulates in the stationary conductive state, which allows current to flow with low voltage.

More specifically, the diode and the switching device in the switching processes of turn-on and turn-off have capacitive components determined by voltage-current characteristics of the space-charge layers and discharge or absorption of charge. Further, there exist resistive components having, as parameters, a value of leakage current at the time of voltage blocking and that of current to be generated by movement of charge, resistive components determined by the state of accumulation of charge in an area outside the space-charge layers and an impurity concentration, and the like. Furthermore, a wiring for electrically connecting the device to another one is provided outside the diode and the switching device, and it includes an inductance component. Therefore, an LCR circuit is to be formed by the capacitive components, the resistive components and the inductance component in the semiconductor device comprising the diode and the switching device.

The concentration distribution of charge varies in the process of turn-on and turn-off of the diode and the switching device, so that the above capacitive components and the resistive components vary widely. With the variations, the condition of natural oscillation is easily satisfied in the LCR circuit, which causes voltage oscillation of the device. The oscillation might generate voltage of a value exceeding the voltage blocking capability of the diode and the switching device. The oscillation might also cause electromagnetic noise in peripheral equipment, which may contribute to blocking a normal operation of the equipment.

The oscillating amplitude of the voltage depends on a voltage applied to the semiconductor device and increases with an increase in the voltage applied. Further, when the resistive components are great and the LCR circuit has a great quality factor, the oscillating amplitude also increases.

As has been described, the device made of silicon carbide can be made much thinner than a device made of silicon for the purpose of improving the relationship between the switching loss and the conduction loss. However, in the case where the device made of silicon carbide is thin, there is a small amount of charge accumulating inside the device and being discharged from the device, so that the resistive components inside the device vary at a high speed in response to turn-on and turn-off. This means an abrupt increase in the resistive components especially at the time of turn-off. When the resistive components in the LCR circuit abruptly increase in the case where the condition of natural oscillation is satisfied and there is voltage oscillation in the LCR circuit, there occurs an increase in the quality factor which exceeds attenuation of voltage oscillation with time, and voltage oscillation having an extremely high amplitude is likely to occur.

Therefore, a diode and a switching device made of silicon carbide can be made thin to improve the relationship between the switching loss and the conduction loss, which, however, is likely to cause voltage oscillation of a device having a high amplitude. Thus, it is forced to limit a voltage to be applied to the device low in order to avoid breakage of the device and malfunction of peripheral equipment, which gives rise to deterioration in the performance of the semiconductor device.

SUMMARY OF THE INVENTION

It is an object of the present invention to provide a semiconductor device comprising a diode and a switching device made of silicon carbide that is capable of suppressing occurrence of voltage oscillation having a high amplitude, while improving the relationship between the switching loss and the conduction loss.

According to the present invention, a semiconductor device comprises at least one of a diode and a switching device each made of silicon carbide, wherein at least one of a resistor and a capacitor is connected in parallel to at least one of the diode and the switching device.

Therefore, it is possible to suppress variations in the resistive component and/or capacitive component accompanied with turn-on or turn-off of at least one of the diode and the switching device in the LCR circuit formed by an external wiring and at least one of the diode and the switching device.

Thus, the LCR circuit is unlikely to satisfy the condition of natural oscillation at the turn-on or turn-off of at least one of the diode and the switching device, which can suppress occurrence of voltage oscillation of the device.

Further, an increase in the quality factor of the LCR circuit can be suppressed at the turn-off of at least one of the diode and the switching device. Therefore, when voltage oscillation of the device occurs, an increase in the amplitude can be suppressed.

Therefore, it is possible to suppress occurrence of voltage oscillation having an extremely high amplitude also when a diode and a switching device made of silicon carbide is made thin to improve the relationship between the switching loss and the conduction loss. This allows avoidance of breakage of the device and malfunction of peripheral equipment. Further, this contributes to improved performance of the semiconductor device because there is no need to limit voltage applied to the device low.

Preferably, at least one of the resistor and the capacitor is made of silicon carbide.

Therefore, the semiconductor device of the present invention is capable of operating stably under a high temperature condition.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 3A, 3B, 4A and 4B are circuit diagrams showing a structure of a semiconductor device according to a second preferred embodiment of the invention;

DESCRIPTION OF THE PREFERRED EMBODIMENTS

<First Preferred Embodiment>

Figure 1A:
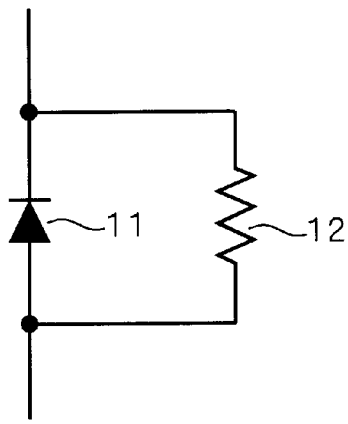
FIGS. 1A, 1B, 2A and 2B are circuit diagrams showing a structure of a semiconductor device according to a first preferred embodiment of the invention.
Figure 1B:
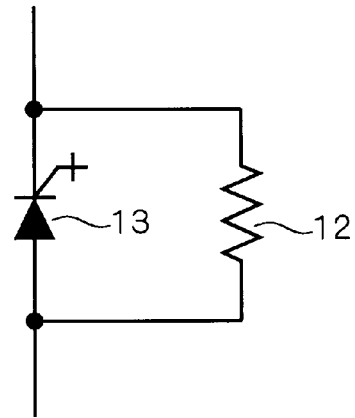

FIGS. 1A and 1B are circuit diagrams showing a structure of a semiconductor device according to the first preferred embodiment of the invention. In the drawings, there are shown a diode 11 made of silicon carbide, a resistor 12 and a switching device GTO 13 made of silicon carbide.

As shown in FIG. 1A, the resistor 12 is connected in parallel to the diode 11 made of silicon carbide. That is, the resistor 12 is connected in parallel to a resistive component of an LCR circuit formed by the diode 11 and an external wiring.

Variations in the resistive component in the LCR circuit can be suppressed because the resistor 12 has a constant resistance value also when the resistive component of the diode 11 varies widely in the process of its turn-on or turn-off. Thus, the LCR circuit is unlikely to satisfy the condition of natural oscillation compared to a conventional semiconductor device not including the resistor 12, which can suppress occurrence of voltage oscillation of the device.

Further, an increase in the resistive component of the LCR circuit can be suppressed also when the resistive component abruptly increases at the turn-off of the diode 11, so that an increase in the quality factor of the LCR circuit can be suppressed. Therefore, when voltage oscillation of the device occurs, an increase in the amplitude thereof can be suppressed.

Although the above description has been directed to the case where the semiconductor device comprises a diode made of silicon carbide, the same effect is obviously obtainable in a semiconductor device comprising a switching device made of silicon carbide such as GTO by connecting the resistor 12 in parallel to the switching device 13 made of silicon carbide as shown in FIG. 1B.

More specifically, variations in the resistive component of the LCR circuit formed by the switching device 13 and the external wiring can be suppressed also when the resistive component of the switching device 13 varies widely in the process of its turn-on or turn-off, and an increase in the resistive component of the LCR circuit can be suppressed at the turn-off of the switching device 13.

Therefore, it is possible to suppress occurrence of voltage oscillation having a high amplitude also when a diode and a switching device made of silicon carbide are made thin to improve the relationship between the switching loss and the conduction loss. This allows avoidance of breakage of the device and malfunction of peripheral equipment. Further, this contributes to improved performance of the semiconductor device because there is no need to limit voltage to be applied to the device low.

Although FIG. 1B shows a GTO as a switching device made of silicon carbide, the present invention is, as a matter of course, applicable to another switching device such as a transistor and an FET.

Figure 2A:
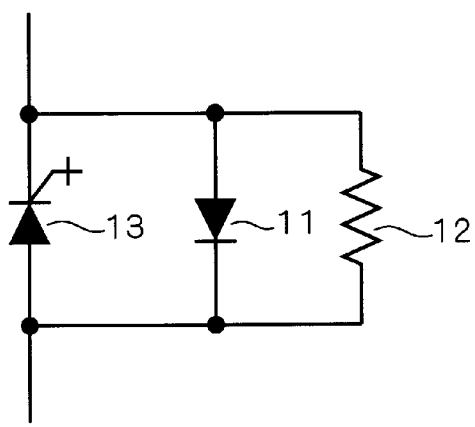
Figure 2B:
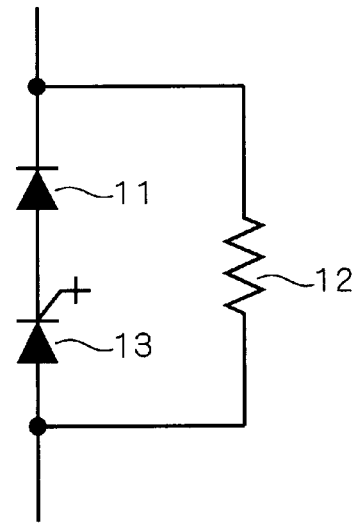

Further, the same effect is obviously obtainable by connecting the resistor 12 in parallel to the diode 11 and the switching device 13 also in a semiconductor device comprising a plurality of diodes and switching devices, as shown in FIGS. 2A and 2B, for example.

<Second Preferred Embodiment>

FIGS. 3A and 3B are circuit diagrams showing a structure of a semiconductor device according to the second preferred embodiment of the invention. In the drawings, there are shown the diode 11 made of silicon carbide, the GTO 13 made of silicon carbide and a capacitor 14.

As shown in FIG. 3A, the capacitor 14 is connected in parallel to the diode 11 made of silicon carbide. That is, the capacitor 14 is connected in parallel to the capacitive component of the LCR circuit formed by the diode 11 and an external wiring.

Variations in the capacitive component of the LCR circuit can be suppressed because the capacitor 14 has a constant capacitance value also when the capacitive component of the diode 11 varies in the process of its turn-on or turn-off. Thus, the LCR circuit is unlikely to satisfy the condition of natural oscillation compared to a conventional semiconductor device not including the capacitor 14. Accordingly, occurrence of voltage oscillation of the device can be suppressed.

The quality factor of the LCR circuit formed by the diode 11 and the external wiring depends on not only the resistive component but also the capacitive component, and may be reduced by increasing the capacitive component. Thus, the capacitor 14 suppresses an increase in the quality factor of the LCR circuit generated at the turn-off of the diode 11. Therefore, when voltage oscillation of the device occurs, an increase in the amplitude thereof can be suppressed.

The above description has been directed to the case where a semiconductor device comprises a diode made of silicon carbide. However, the same effect is obviously obtainable by connecting the capacitor 14 in parallel to the switching device 13 made of silicon carbide in a semiconductor device comprising a switching device such as a GTO made of silicon carbide, as shown in FIG. 3B.

More specifically, variations in the capacitive component of the LCR circuit formed by the switching device 13 and the external wiring can be suppressed also when the capacitive component of the switching device 13 varies widely in the process of its turn-on or turn-off. Further, an increase in the quality factor of the LCR circuit can be suppressed at the turn-off of the switching device 13.

Therefore, it is possible to suppress occurrence of voltage oscillation having a high amplitude also when a diode and a switching device made of silicon carbide are made thin to improve the relationship between the switching loss and the conduction loss. This allows avoidance of breakage of the device and malfunction of peripheral equipment. Further, this contributes to improved performance of the semiconductor device because there is no need to limit voltage to be applied to the device low.

Although FIG. 3B shows the GTO as a switching device made of silicon carbide as an example, the present invention is, as a matter of course, readily applicable to another switching device such as a transistor and an FET.

Further, the same effect is obviously obtainable by connecting the capacitor 14 in parallel to the diode 11 and the switching device 13 in a semiconductor device comprising a plurality of diodes and switching devices, as shown in FIGS. 4A and 4B, for example.

<Third Preferred Embodiment>

Figure 5A:
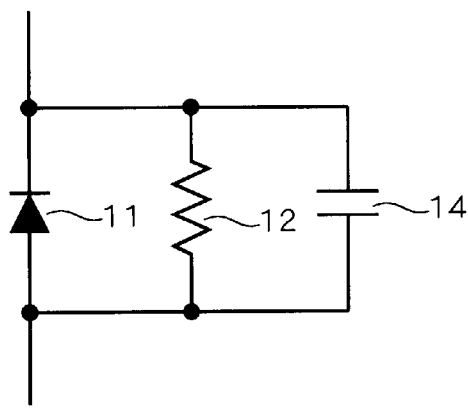
FIGS. 5A and 5B are circuit diagrams showing a structure of a semiconductor device according to a third preferred embodiment of the invention.
Figure 5B:
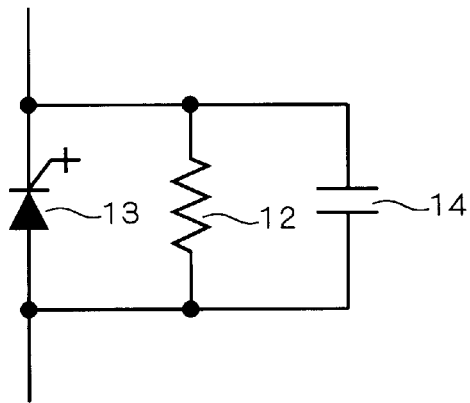

FIGS. 5A and 5B are circuit diagrams showing a structure of a semiconductor device according to the third preferred embodiment of the invention. In the drawings, there are shown the diode 11 made of silicon carbide, the resistor 12, the GTO 13 made of silicon carbide and the capacitor 14.

FIG. 5A is an exemplary view in which the resistor 12 and the capacitor 14 are connected in parallel to the diode 11 made of silicon carbide. That is, the resistor 12 and the capacitor 14 are respectively connected in parallel to the resistive component and the capacitive component of the LCR circuit formed by the diode 11 and the external wiring.

Therefore, variations in the resistive component and the capacitive component of the LCR circuit can be suppressed also in the process of the turn-on or turn-off of the diode 11. Thus, the LCR circuit is further unlikely to satisfy the condition of natural oscillation compared to the semiconductor device according to the first and second embodiments. Accordingly, occurrence of voltage oscillation of the device can be suppressed.

Further, the resistor 12 and the capacitor 14 suppress an increase in the resistive component of the LCR circuit at the turn-off of the diode 11. Therefore, when voltage oscillation of the device occurs, an increase in the amplitude thereof can be suppressed.

As shown in FIG. 5B, the same effect is obviously obtainable in a semiconductor device in which the resistor 12 and the capacitor 14 are connected in parallel to the switching device 13 made of silicon carbide, and detailed explanation is omitted here.

<Fourth Preferred Embodiment>

Figure 6:
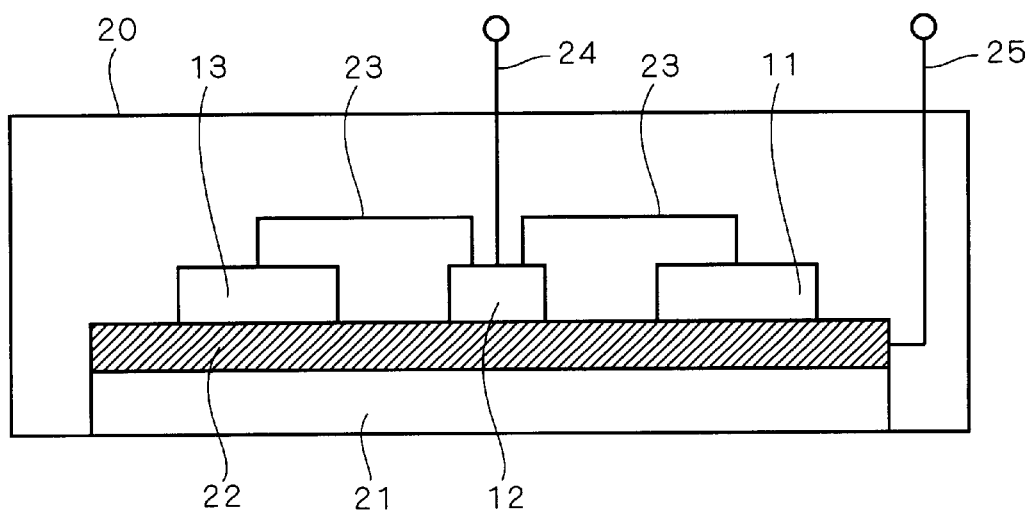
FIG. 6 is a sectional view showing a structure of a semiconductor device according to a fourth preferred embodiment of the invention.
Figure 7A:
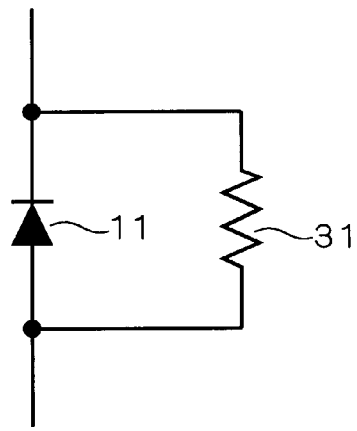
FIGS. 7A through 7D are circuit diagrams showing a structure of a semiconductor device according to a fifth preferred embodiment of the invention.
Figure 7B:
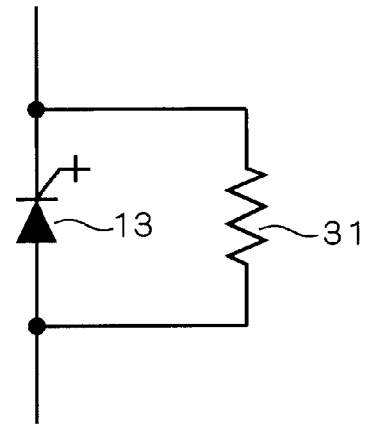
Figure 7C:
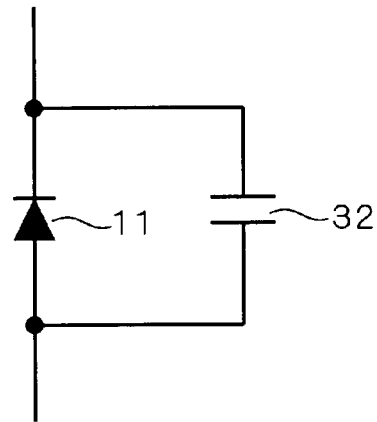
Figure 7D:
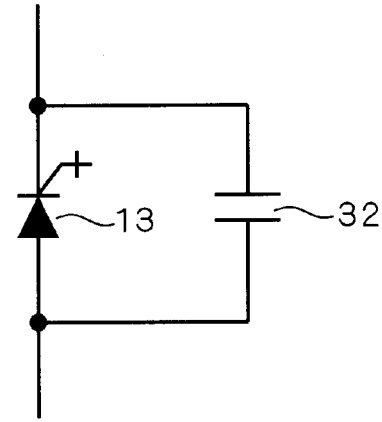

FIG. 6 is a sectional view showing a structure of a semiconductor device according to the fourth preferred embodiment, configured by the circuit diagram shown in FIG. 2A. In the drawings, there are shown: the diode 11 made of silicon carbide; the resistor 12; the switching device 13 made of silicon carbide; a sealed package 20 for enclosing the diode 11, the switching device 13 and the resistor 12, having a heat sink 21 for radiating heat; a conductive plate 22; a bonding wire 23; and conductive bars 24 and 25.

Bottom surfaces of the diode 11, the switching device 13, and the resistor 12 are soldered on the conductive plate 22 to be connected to each other, and are connected to the conductive bar 25 through the conductive plate 22. Top surfaces of the diode 11, the switching device 13, and the resistor 12 are connected to each other through the bonding wire 23 and further connected to the conductive bar 24. The conductive plate 22 is equipped with the heat sink 21, and heat generated by the dissipations at the diode 11, the switching device 13 and the resistor 12 in the sealed package 20 is radiated through the heat sink 21.

The resistor 12 is enclosed in the sealed package 20 together with the diode 11 and the switching device 13, which allows size reduction of the semiconductor device.

Further, heat generated by the dissipations can readily be radiated through the heat sink 21, so that variations in temperature of the device can be suppressed. This can suppress variations in characteristics due to the variations in temperature, which allows the semiconductor device to maintain stable performances.

As described, FIG. 6 shows the semiconductor device configured by the circuit diagram shown in FIG. 2A, however, the circuit configuration is not limited as such, and may be applied widely to a semiconductor device having a diode and a switching element made of silicon carbide.

Further, the same effect is obviously obtainable with a structure in which a capacitor is connected in parallel to a diode and a switching device or a structure in which a resistor and a capacitor are both connected in parallel to a diode and a switching device.

<Fifth Preferred Embodiment>

FIGS. 7A through 7D are circuit diagrams showing a structure of a semiconductor device according to the fifth preferred embodiment. In the drawings, there are shown the diode 11 made of silicon carbide, the GTO 13 made of silicon carbide, a resistor 31 and a capacitor 32 both made of silicon carbide.

That is, according to the semiconductor device of the present embodiment, the resistor and the capacitor connected in parallel to the diode and the switching device made of silicon carbide are made of silicon carbide in the semiconductor devices described in the first to third embodiments.

Thus, the diode 11, the switching device 13, the resistor 31 and the capacitor 32 forming the circuit are all made of silicon carbide. As aforementioned, silicon carbide has a wide energy gap between bands, resulting in its excellent thermal stability. Thus, the semiconductor device according to the present embodiment may stably operate even at high temperatures.

<Sixth Preferred Embodiment>

Figure 8:
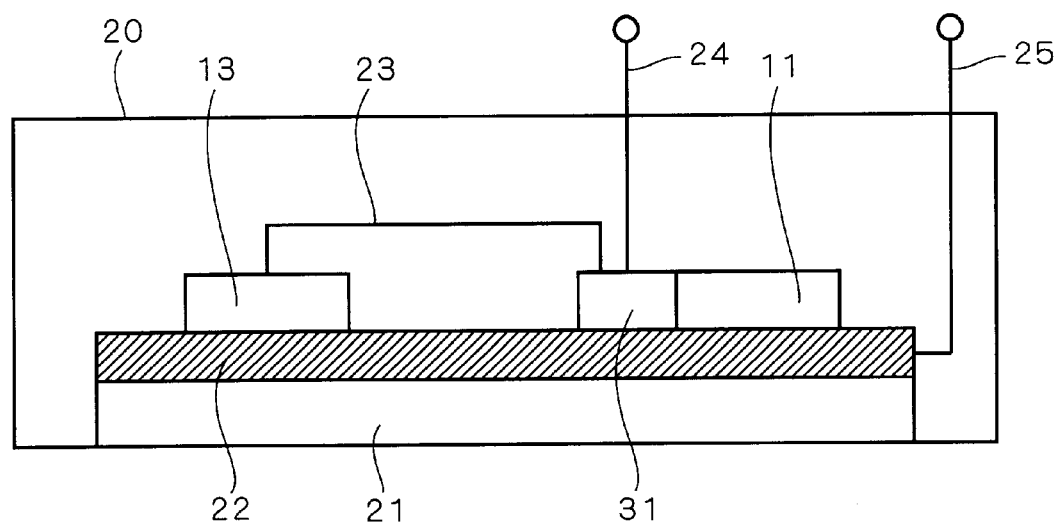
FIG. 8 is a sectional view showing a structure of a semiconductor device according to a sixth preferred embodiment of the invention.

FIG. 8 is a sectional view showing a structure of a semiconductor device according to the sixth preferred embodiment, configured by the circuit diagram shown in FIG. 2A similarly to FIG. 6, with the exception that the resistor 31 made of silicon carbide is connected in parallel to the diode 11 and the switching device 13 and is formed in the same substrate in which the diode 11 is formed. Other elements are the same as those in FIG. 6 with the same reference numerals, and repeated explanation is omitted.

Since the diode 11 and the resistor 31 are both made of silicon carbide, they can be formed in the same substrate as shown in FIG. 8. Forming the resistor 31 and the diode 11 in the same substrate can facilitate the wiring operation of the bonding wire 23, and further allows reduction of a space necessary for wiring of the bonding wire 23. This can contribute to cost reduction and size and weight reduction of the semiconductor device.

Although the resistor 31 is formed in the same substrate in which the diode 11 is formed in FIG. 8, the same effect is obviously obtainable in a structure where the resistor 31 is formed in the same substrate in which the switching device 13 is formed.

Further, although FIG. 8 shows the semiconductor device configured by the circuit diagram shown in FIG. 2A as described above, the circuit configuration is not limited as such, and the present embodiment is widely applicable to a semiconductor device having a diode and a switching element made of silicon carbide.

Furthermore, the same effect is obviously obtainable in a structure where a capacitor is connected in parallel to the same substrate in which a diode and a switching device are formed, or a structure where a resistor and a capacitor are both formed in the same substrate in which a diode and a switching device are formed.

<Seventh Preferred Embodiment>

Figure 9:
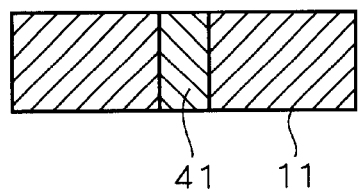
FIG. 9 is an explanatory view of a structure of a semiconductor device according to a seventh preferred embodiment of the invention.

FIG. 9 is an explanatory view of a structure of a semiconductor device according to the seventh preferred embodiment. There are shown the diode 11 and crystal defect 41 of silicon carbide in the diode 11.

Generally, crystal defect increases current leakage in a diode or a switching device. In other words, crystal defect can reduce the resistive component when the diode or a switching device is nonconducting. That is, forming crystal defect locally in a device made of silicon carbide becomes equivalent to arranging a resistor in parallel to the device. In short, the circuit configuration shown in FIG. 9 is the same as the circuit diagram of FIG. 7A.

Although FIG. 9 shows the diode as a device made of silicon carbide, the present embodiment is obviously applicable to a switching device such as a GTO made of silicon carbide.

Here, the resistor connected in parallel to the diode and the switching device is formed by crystal defect in the device, so that these elements are naturally formed in the same substrate. This can contribute to cost reduction and size and weight reduction of the semiconductor device as in the sixth preferred embodiment.

Further, there is no need to discriminate between a device area and a resistance area, which allows the resistor to be readily formed in the same substrate in which the device is formed.

Although the present invention will be especially effective for a semiconductor device with high voltage such as a power converter, it is not limited to such a range of application but is readily applicable to all types of semiconductor devices.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising at least one of a diode and a switching device each made of silicon carbide, wherein
    at least one of a resistor and a capacitor is connected in parallel to at least one of said diode and said switching device, and
    at least one of said diode and said switching device and at least one of said resistor and said capacitor are enclosed in a single package.

2. The semiconductor device according to claim 1, wherein said package further includes a heat sink.

3. A semiconductor device comprising at least one of a diode and a switching device each made of silicon carbide, wherein
    at least one of a resistor and a capacitor is connected in parallel to at least one of said diode and said switching device,
    at least one of said resistor and said capacitor is made of silicon carbide, and
    at least one of said diode and said switching device and at least one of said resistor and said capacitor are formed in a single substrate made of silicon carbide.

4. The semiconductor device according to claim 3, wherein said resistor is formed by crystal defect in at least one of said diode and said switching device.

* * * * *